(12) United States Patent
Phommahaxay et al.

(10) Patent No.: US 9,061,897 B2
(45) Date of Patent: Jun. 23, 2015

(54) METHODS FOR EMBEDDING CONDUCTING MATERIAL AND DEVICES RESULTING FROM SAID METHODS

(75) Inventors: Alain Phommahaxay, Leuven (BE); Lieve Bogaerts, Bekkevoort (BE); Philippe Soussan, Marseilles (FR)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 13/292,261

(22) Filed: Nov. 9, 2011

(65) Prior Publication Data

US 2012/0126391 A1 May 24, 2012

Related U.S. Application Data

(60) Provisional application No. 61/415,680, filed on Nov. 19, 2010.

(30) Foreign Application Priority Data

Nov. 19, 2010 (EP) .................................. 10191819

(51) Int. Cl.
*H01L 23/12* (2006.01)
*B81C 1/00* (2006.01)

(52) U.S. Cl.
CPC ..... *B81C 1/00896* (2013.01); *B81C 2203/0109* (2013.01); *B81C 2203/035* (2013.01)

(58) Field of Classification Search
USPC ......... 257/254, 415, 433, 678, 704, 710, 779, 257/E23.18, E23.193, E21.5, E23.181, 257/E29.324; 438/50, 118, 121, 124–125, 438/127
See application file for complete search history.

(56) References Cited

U.S. PATENT DOCUMENTS

| | | | |
|---|---|---|---|
| 6,297,072 B1 * | 10/2001 | Tilmans et al. | 438/106 |
| 6,969,639 B2 * | 11/2005 | Cho et al. | 438/118 |
| 2002/0076873 A1 | 6/2002 | Spooner et al. | |
| 2004/0067604 A1 * | 4/2004 | Ouellet et al. | 438/108 |
| 2004/0147056 A1 * | 7/2004 | McKinnell et al. | 438/52 |
| 2005/0170546 A1 * | 8/2005 | Patel et al. | 438/48 |
| 2005/0275079 A1 | 12/2005 | Stark | |
| 2006/0071324 A1 * | 4/2006 | Lu et al. | 257/704 |
| 2006/0115323 A1 * | 6/2006 | Coppeta et al. | 403/270 |

(Continued)

OTHER PUBLICATIONS

Hasegawa, Atsushi et al., "Heat-Resistant, Self-Releasing Tape and Its Application", IEEE Polytronic 2007 Conference, pp. 290-292.

(Continued)

*Primary Examiner* — Khaja Ahmad
(74) *Attorney, Agent, or Firm* — McDonnell Boehnen Hulbert & Berghoff LLP

(57) ABSTRACT

Disclosed are methods for forming semiconductor devices and the semiconductor devices thus obtained. In one embodiment, the method may include providing a semiconductor wafer comprising a surface, forming on the surface at least one device, forming a release layer at least in an area of the surface that encircles the at least one device, forming on the release layer at least one wall structure around the at least one device, and forming at least one cap on the at least one wall structure. In one embodiment, the device may include a substrate comprising a surface, at least one device formed on the surface, a release layer formed at least in an area of the surface that encircles the at least one device, at least one wall structure formed around the at least one device, and at least one removable cap formed on the at least one wall structure.

18 Claims, 4 Drawing Sheets

(56) References Cited

U.S. PATENT DOCUMENTS

| | | | |
|---|---|---|---|
| 2007/0013082 A1* | 1/2007 | Shiraishi | 257/777 |
| 2007/0045781 A1* | 3/2007 | Carlson et al. | 257/632 |
| 2009/0142615 A1* | 6/2009 | Ekstein et al. | 428/627 |
| 2010/0020382 A1 | 1/2010 | Su et al. | |
| 2010/0304146 A1* | 12/2010 | Krebs et al. | 428/409 |

OTHER PUBLICATIONS

Witvrouw, A. et al., "Packaging of 11 MPIXEL CMOS-Integrated Sige Micro-Mirror Arrays", Micro Electro Mechanical Systems, 2009, IEEE 22nd International Conference, Jan. 25, 2009, pp. 136-139.

European Search Report, European Patent Application No. 10191819.1 dtaed Jun. 15, 2011.

Hu, Chao-Chang et al., "Solder Bonding With a Buffer Layer for MOEMS Packaging Using Induction Heating", Microsyst Technol., vol. 12, 2006, pp. 1011-1014.

"USS MicroTec Bonders for Temporary and Permanent 3D Bonding Solutions", http://pftle.net/?cat=119&paged=2, Jun. 24, 2009, 4 pages.

* cited by examiner

METHODS FOR EMBEDDING CONDUCTING MATERIAL AND DEVICES RESULTING FROM SAID METHODS

CROSS-REFERENCE TO RELATED APPLICATIONS

This application is a nonprovisional of U.S. Provisional Patent Application Ser. No. 61/415,680 filed Nov. 19, 2010, the contents of which are hereby incorporated by reference. Further, this application claims priority to European Patent Application Serial No. 10191819.1 filed Nov. 19, 2010, the contents of which are hereby incorporated by reference.

BACKGROUND

Microelectromechanical system (MEMS) devices are typically very sensitive, such that it is difficult to dice a wafer or substrate comprising MEMS devices once the MEMS devices have been released. Further, even if the MEMS devices are not released until after the dicing, it is still difficult to handle the diced MEMS devices. As a result, many MEMS devices are often damaged during handling.

In an effort to protect MEMS devices, many commercial MEMS devices are packaged by a permanent cap (e.g., capping chip or capping layer) prior to dicing. In many cases, however, such a cap is not feasible. For example, micro-optoelectromechanical system (MOEMS) devices cannot function with a permanent cap, as the permanent cap blocks light from reaching the MOEMS.

In some cases, rather than using a cap to protect MEMS devices, ultraviolet dicing tape may be used. However, ultraviolet dicing tape may damage the MEMS devices during removal and/or may leave behind a residue. It is possible to pattern the ultraviolet dicing tape around the devices (e.g., in a ring), but this requires non-standard tools, such as a programmable cutting table.

SUMMARY

Disclosed are methods for fabricating semiconductor devices and the semiconductor devices thus obtained. In particular, microelectromechanical systems (MEMS) devices are considered. The disclosed methods and devices involve a cap formed to protect the MEMS devices.

In one aspect, a method is disclosed. The method may include providing a semiconductor wafer comprising a surface, forming on the surface at least one device, forming a release layer at least in an area of the surface that encircles the at least one device, forming on the release layer at least one wall structure around the at least one device, and forming at least one cap on the at least one wall structure.

In some embodiments, forming the release layer comprises forming the release layer while forming the at least one device. In other embodiments, forming the release layer comprises forming the release layer after forming the at least one device.

In some embodiments, the semiconductor wafer comprises a silicon wafer. In these embodiments, forming the release layer may comprise depositing a sequence of silicon carbide layers using plasma enhanced chemical vapour deposition.

In some embodiments, the release layer has a first thermal expansion coefficient and at least a portion of the wall structure that is in contact with the release layer has a second thermal expansion coefficient that differs from the first thermal expansion coefficient.

In some embodiments, the at least one wall structure comprises at least one first metal layer, the at least one cap comprises at least on second metal layer, and forming the at least one cap on the at least one wall structure comprises contacting the at least one first metal layer and the at least one second metal layer and heating the at least one first metal layer and the at least one second metal layer, thereby forming a welded connection between the at least one wall structure and the at least one cap. In these embodiments, the at least one first metal layer may comprise copper, the at least one second metal layer may comprise tin, and the welded connection may comprise a copper-tin bond.

In some embodiments, the method may further comprise heating the release layer and at least a portion of the at least one wall structure, thereby releasing the at least one cap and the at least one wall structure from the wafer.

In some embodiments, the method may further comprise heating the release layer and at least a portion of the at least one wall structure and applying a mechanical force to the at least one wall structure and the at least one cap, thereby releasing the at least one cap and the at least one wall structure from the wafer.

In some embodiments, the method may further comprise applying a mechanical force to the at least one wall structure and the at least one cap, thereby releasing the at least one cap and the at least one wall structure from the wafer.

In some embodiments, the at least one wall structure comprises a plurality of wall structures and the at least one cap structure comprises one cap structure. In these embodiments, the method may further comprise dicing the wafer, thereby separating the plurality of wall structures from one another.

In another aspect, a device is disclosed. The device may comprise a substrate comprising a surface, at least one device formed on the surface, a release layer formed at least in an area of the surface that encircles the at least one device, at least one wall structure formed around the at least one device, and at least one removable cap formed on the at least one wall structure.

In some embodiments, the substrate comprises a silicon substrate.

In some embodiments, the release layer comprises a stack of silicon carbide layers.

In some embodiments, the at least one wall structure comprises at least one first metal layer, the at least one cap comprises at least on second metal layer, and a welded connection is formed between the at least one wall structure and the at least one cap. In these embodiments, the at least one first metal layer may comprise copper, the at least one second metal layer may comprise tin, and the welded connection may comprise a copper-tin bond.

In some embodiments, the release layer has a first thermal expansion coefficient and at least a portion of the wall structure that is in contact with the release layer has a second thermal expansion coefficient that differs from the first thermal expansion coefficient.

In some embodiments, the at least one device comprises a microelectromechanical systems device.

Figure 1A:
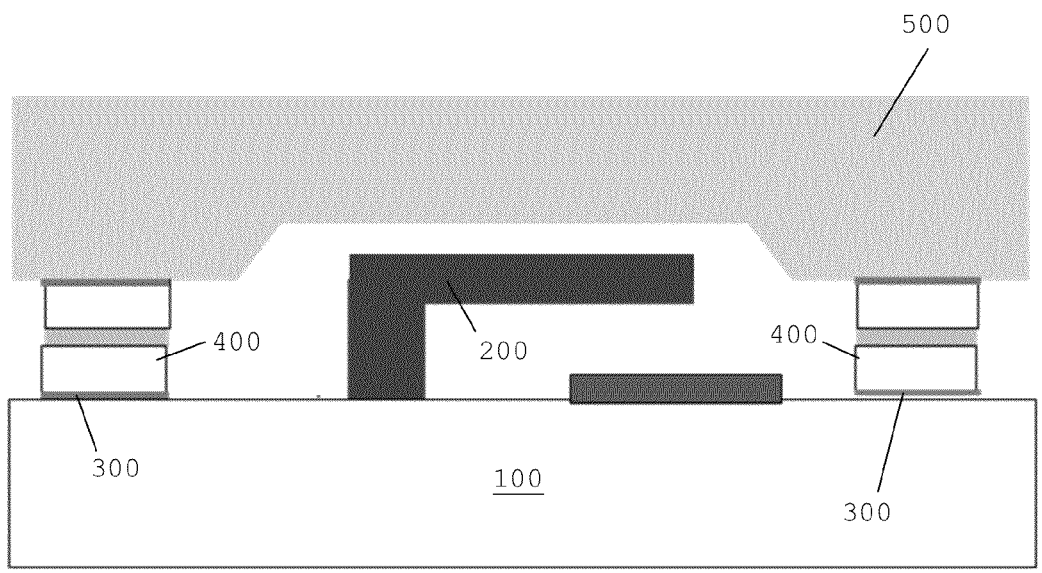
FIGS. 1A and 1B illustrate example devices, in accordance with an embodiment.

It is to be understood that the figures are merely illustrative and are not meant to be limiting. In particular, the relative dimensions of the components shown in the drawings may differ from those shown.

DETAILED DESCRIPTION

Figure 1B:
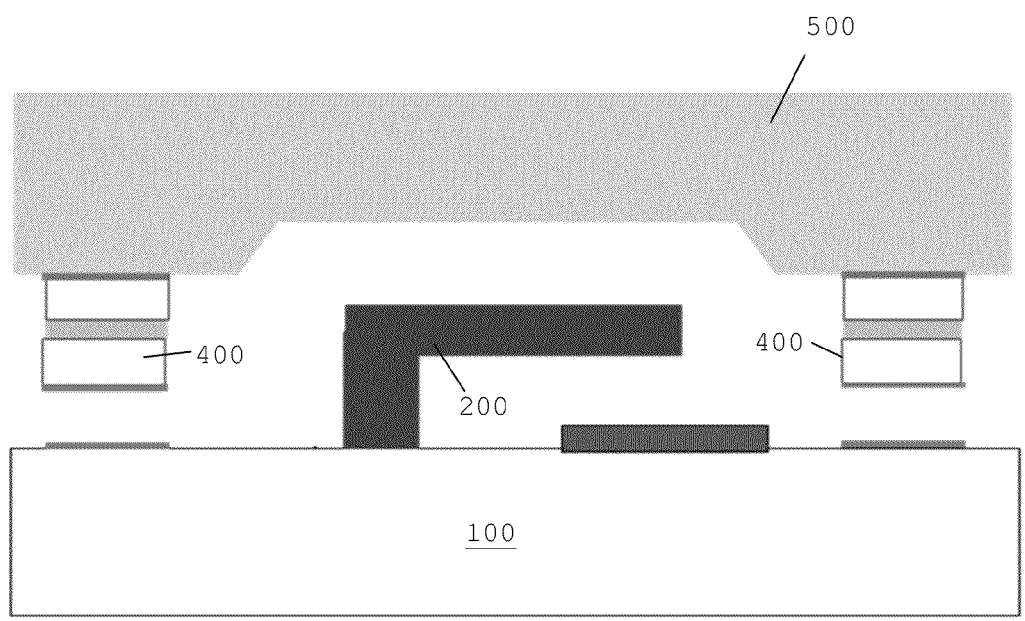

FIGS. 1A and 1B illustrate example devices, in accordance with an embodiment. A wafer 100 is shown. At least one MEMS device 200 is formed on its surface using, for example, typical MEMS fabrication processes. As shown, a release layer 300 is produced on the wafer 100. The release layer 300 is formed at least in an area that encircles at least one of the at least one MEMS devices 200. Further, a support wall structure 400 is formed on and in contact with the release layer 300. Thereafter, a cap 500 is formed on the support wall structure 400. The composition and mechanical characteristics of the release layer 300 and of the wall structure 400 are such that the cap 500 and the support wall structure 400 are removable from the wafer 100 through application of a first removing force to the support wall structure 400 and/or the cap 500. As a result of the first removing force, the release layer 300 and/or an interface between the release layer 300 and the support wall structure 400 and/or an interface between the wafer 100 and the release layer 300 will break more easily than the support wall structure 400, such that the release layer 300 may be removed, as shown in FIG. 1B. As a result, the cap 500 and the support wall structure 400 may be released from the wafer 100, as further shown in FIG. 1B.

The cap 500 may additionally be removed. To this end, a second removing force may be applied to the cap 500 and/or the support wall structure 400. In some embodiments, the release layer 300 may have a different thermal expansion coefficient than a portion or all of the support wall structure 400. In these embodiments, applying the second removing force may comprise heating the release layer 300 and the portion or all of the support wall structure 400, leading to a heat-induced stress that generates the second removing force. The second removing force may be oriented substantially along the plane of the release layer 300. In other embodiments, applying the second removing force may alternatively or additionally involve applying a mechanical removing force.

In some embodiments, the release layer 300 may be formed along with the at least one MEMS device 200. For example, the release layer 300 may be a functional layer of the MEMS fabrication process. This is illustrated in FIGS. 2A-F. It is to be understood, however, that, in other embodiments, the release layer 300 may be formed in a separate process.

Figure 2A:
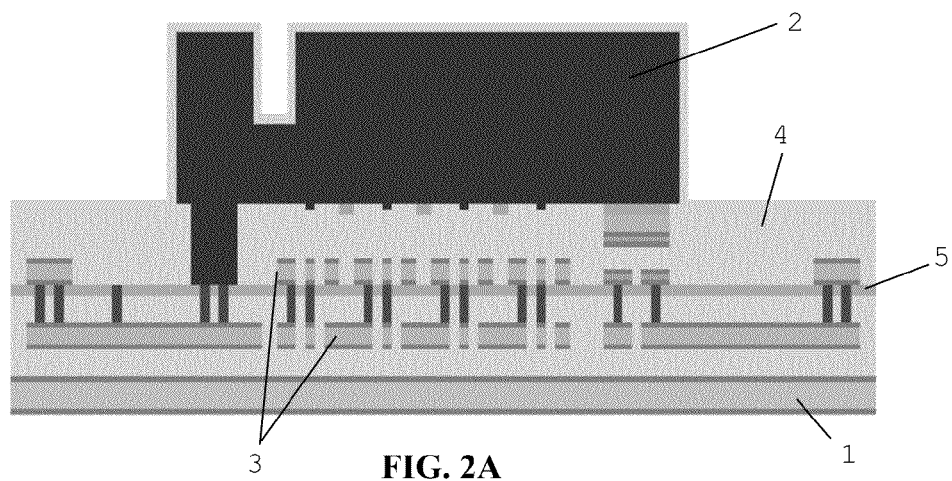
FIGS. 2A to 2F illustrate an example method for forming a device, in accordance with an embodiment.

FIG. 2A shows an MEMS device 2 formed on a silicon wafer 1. Metallic connection structures 3 are visible, as well as a sacrificial silicon oxide layer 4 and a silicon carbide passivation layer 5, which may be applied during MEMS processing to protect the underlying layers. The passivation layer 5 also acts as the release layer of the invention. In some embodiments, the passivation layer 5 may be produced as a sequence of thin SiC layers through a series of Plasma Enhanced Chemical Vapour Deposition (PECVD) steps. For example, a sequence of 4 layers of SiC each having a thickness of 80 nm may be produced. The passivation layer 5 may be produced in other manners as well.

Figure 2B:
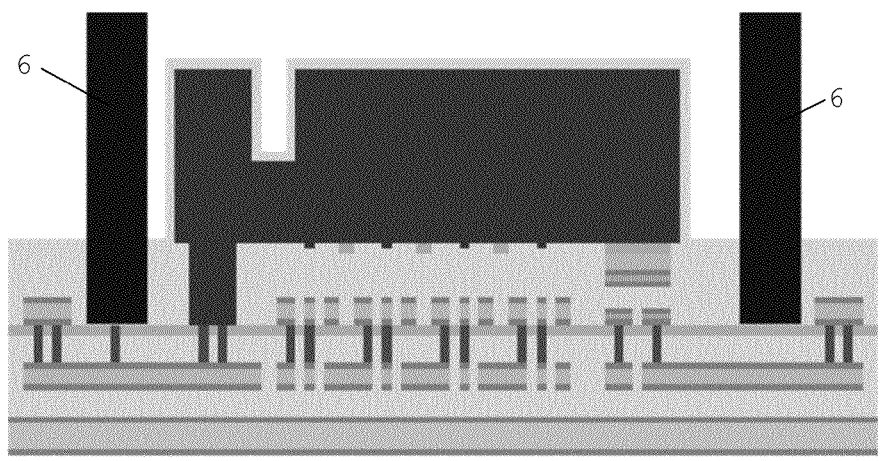

A support wall structure 6 is formed on the passivation layer 5, as shown in FIG. 2B. The support wall structure 6 may be formed using, for example, lithography or etch techniques in combination with PECVD and Electrochemical Deposition (ECD). In particular, in order to form the support wall structure 6, a trench may be etched in the sacrificial oxide layer 4, thereby exposing the release layer 5 in the area encircling the MEMS device 2. Thereafter, using PVD and ECD, the support wall structure 6 may be formed on the exposed portion of the release layer 5.

The support wall structure 6 may comprise, for example, Cu. As shown, the support wall structure 6 substantially encircles the MEMS device 2. In some embodiments, the support wall structure 6 may comprise a number of layers, such as a diffusion barrier layer, a thin PVD Cu layer, and a thicker ECD Cu layer. Further, in some embodiments, the support wall structure 6 may be taller than the MEMS device 2, as shown. The release layer 5 may have a thermal expansion coefficient that is different from a thermal expansion coefficient of the support wall structure 6, or different from a thermal expansion coefficient of a portion of the wall structure that is in direct contact with the release layer 5.

Figure 2C:
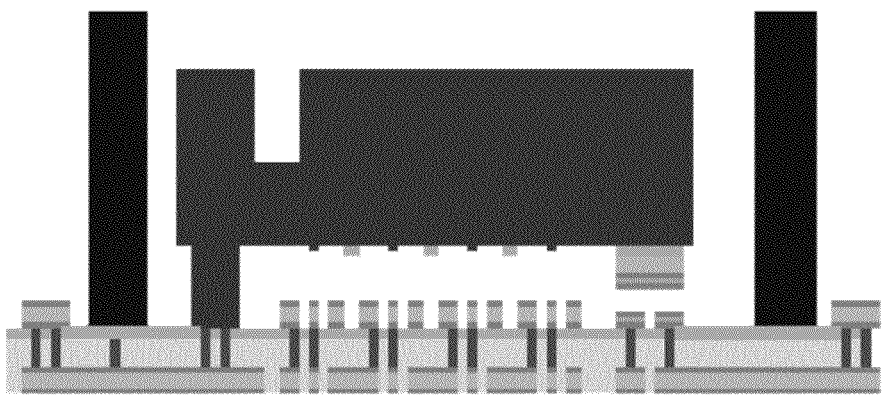
Figure 2D:
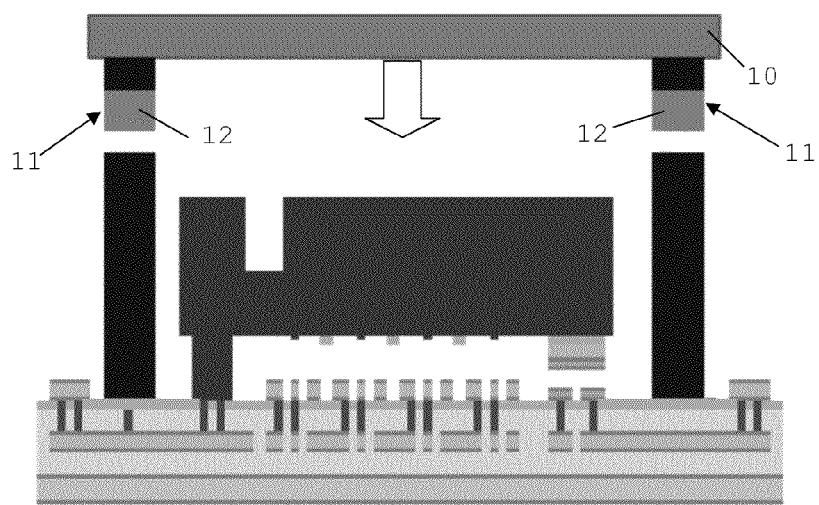

As shown in FIG. 2C, the sacrificial oxide layer 4 may be removed using, for example, a vapour HF etch. Thereafter, a cap 10 may be formed, as shown in FIG. 2D. The cap may comprise any suitable materials, such as silicon, glass, or metal, and may have any suitable shape, such as a disc shape. Other materials and shapes are possible as well.

As shown in FIG. 2D, an additional wall structure 11 may be formed on a surface of the cap 10. The additional wall structure 11 may correspond (e.g., in circumference and/or wall thickness) to the wall structure 6 formed on the wafer 1. As illustrated, the cap 10 may be lowered onto the wafer 1, and the additional wall structure 11 may be welded to the wall structure 6. To this end, a gripping tool used to lower the cap 10 onto the wafer 1 may be heated. The welding may take other forms as well. In some embodiments, the release layer 5 may not be heated.

The additional wall structure 11 may comprise a layer 12 of Sn at the top, so that the weld is obtained by formation of a Sn—Cu bond. In some embodiments, a cap 10 comprising a single wall structure may be applied to a wafer 1 comprising a single MEMS device 2, while in other embodiments a single cap 10 comprising a plurality of additional wall structures may be applied to a wafer 1 comprising a plurality of MEMS devices and a plurality of wall structures. In the latter embodiments, the wafer may be diced to separate the MEMS devices following the welding.

Figure 2E:
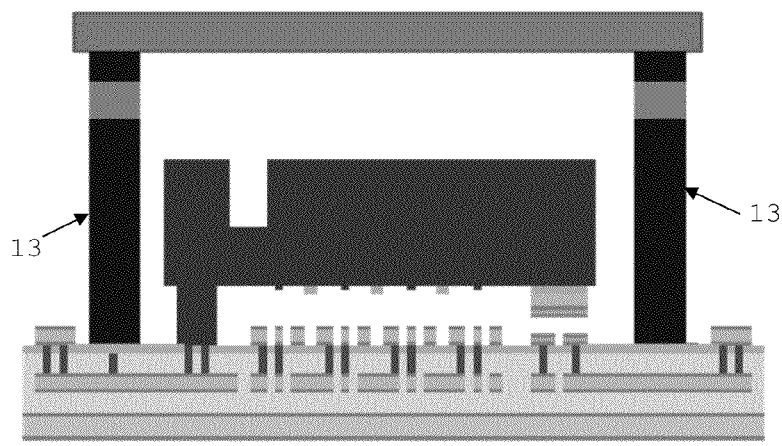

Following the welding, the wall structure 6 and the additional wall structure 11 may together form a welded wall structure 13, as shown in FIG. 2E. The welded wall structure 13 may serve to protect the MEMS device 2. It is to be understood that in some embodiments, the additional wall structure 11 may not be present, and the cap 10 may be welded directly to the wall structure 6.

Figure 2F:
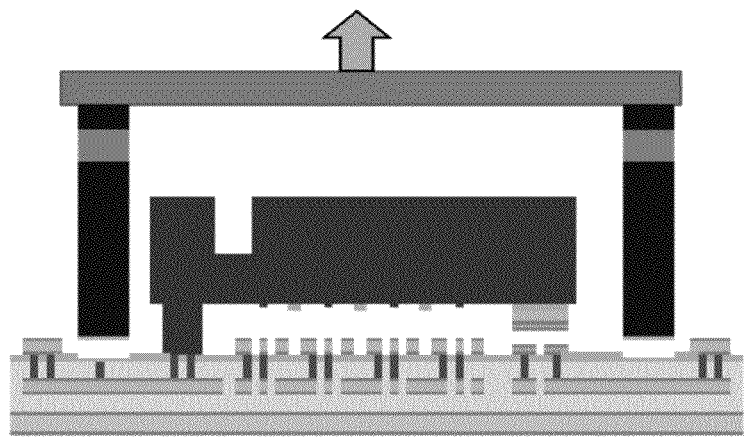

The structure shown in FIG. 2E may exhibit improved robustness as compared to typical MEMS devices. Accordingly, the structure may be transported and handled more easily. Once the structure is mounted as desired for a particular application, the cap 10 and/or the welded wall structure 13 may be removed, as illustrated in FIG. 2F. To this end, the release layer 5 may be heated. For example, the release layer 5 may be heated through the wafer 1 and/or the cap 10. The release layer 5 may be heated in other manners as well.

Due to a difference in expansion coefficients between the release layer 5 and the welded wall structure 13, a transverse force may be exerted on the release layer 5. In some embodiments, this heating may be sufficient to cause breaking of the release layer 5. In other embodiments, a mechanical force may be applied along with the heating. For example, the cap 10 may be gripped and twisted around a central axis of the welded wall structure 13. In still other embodiments, only a mechanical force may be applied. The release layer 5 may break along a place in the release layer 5, along an interface between the release layer 5 and the welded wall structure 13, and/or along an interface between the release layer 5 and the wafer 1.

In an example embodiment, the release layer 5 may comprise SiC sublayers. In this embodiment, the release layer 5 may break along one or more interfaces of the sublayers. In another example embodiment, the dimensions of the welded wall structure (e.g., height, width, and shape) may be designed such that stress resulting from heating and/or a mechanical force is highest in the release layer 5, so as to ensure that the release layer 5 will break before the welded wall structure 13.

Referring again to FIGS. 1A-B, it is to be understood that, in some embodiments, the wall structure 400 may be a continuous wall structure encircling the MEMS device 200, such as a wall with a circular cross-section so that a cylindrical enclosure is formed around the MEMS device 200. In other embodiments, the wall structure may not be continuous, but rather may be formed of arcs places around the MEMS device 200. In embodiments where the release layer 300 is formed as a process separate from the MEMS fabrication process (e.g., after the MEMS fabrication process), the release layer 300 may be produced at least in at least a portion of an area encircling the MEMS device 200, and the wall structure 400 may be formed on the release layer 300.

Figure 3:
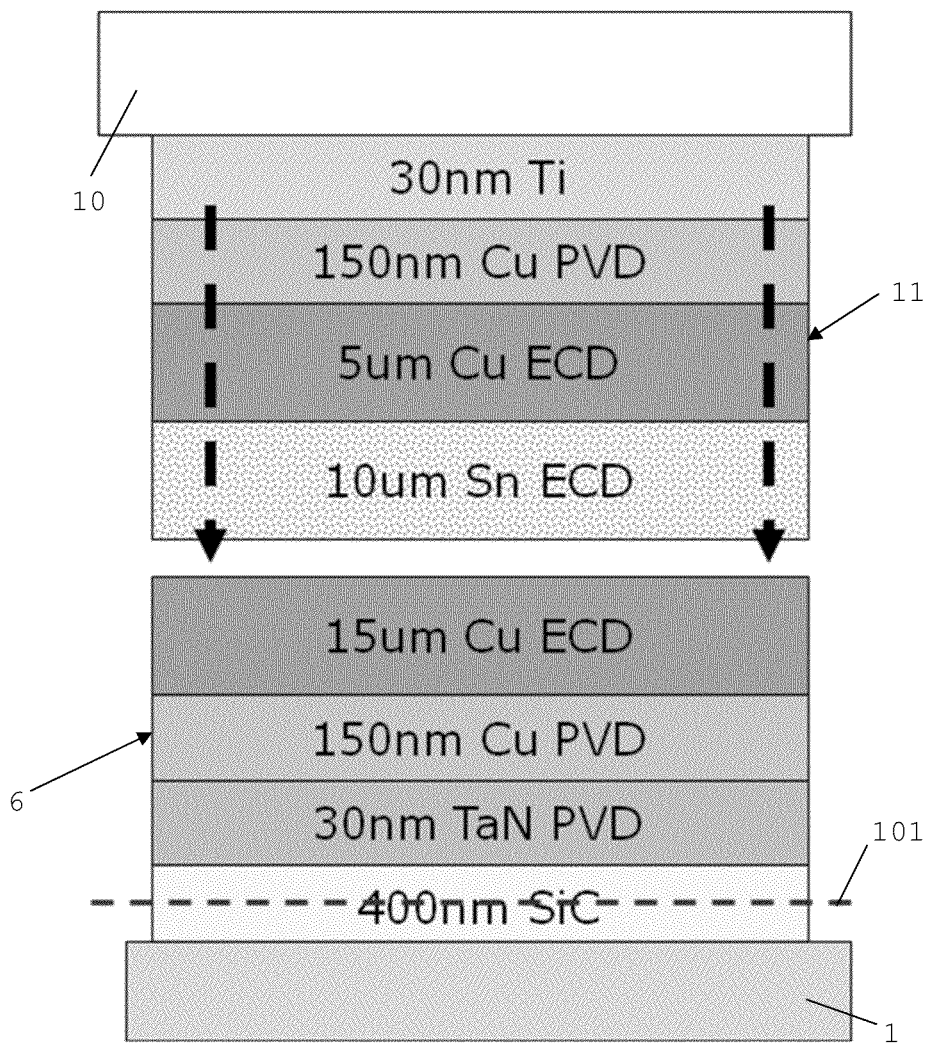
FIG. 3 shows an example composition of wall structures in a device, in accordance with an embodiment.

FIG. 3 shows an example composition of wall structure 6 and additional wall structure 11 in a device, in accordance with an embodiment. As shown, wall structure 6 may comprise, for example, a number of layers produced onto a 400 nm SiC layer (e.g., the release layer 5). The release layer 5 may comprise four SiC layers of 100 nm thick deposited at 350° C. with interface hardening by He plasma in between each layer deposition. The layers of the wall structure 6 may include a 30 nm TaN diffusion barrier, applied by PVD; a 150 nm Cu layer applied by PVD; and a 15 µm Cu layer applied by ECD. Further, the additional wall structure 6 may comprise a 30 nm Ti layer; a 150 nm Cu layer applied by PVD; a 5 µm Cu layer applied by ECD; and a 10 µm Sn layer applied by ECD. As described above, the wall structure 6 and the additional wall structure 11 may be welded together. During welding, the 15 µm Cu layer and 10 µm Sn layer may be contacted and welded together by heating only the cap 10 at 250° C. and by applying a mechanical pressure of 0.1 MPa.

As noted above, the release layer 5 may be released along an interface place of the release layer. As shown, the release layer 5 breaks along an interface between SiC sublayers of the release layer 5, as indicated by dotted line 101. In this manner, the cap 10 may be released.

In some embodiments, the welded wall structure 13 may have a height greater than, for example, 20 µm. Further, in some embodiments, the welded wall structure 13 may have a width of about, for example, 100 µm. Still further, in some embodiments, releasing the release layer 5 may involve heating the full assembly to 250° C. and applying an upward mechanical force to the cap 10 with a gripping tool.

Other release layers, wall structures, additional wall structures, caps, welding parameters, dimensions, and release mechanisms are possible as well.

What is claimed is:

1. A capped semiconductor device, comprising:
   a substrate comprising a surface;
   at least one device formed on the surface;
   a release layer formed at least in an area of the surface that encircles the at least one device, wherein the release layer comprises a stack of silicon carbide layers having helium plasma treated interfaces between adjacent ones of the silicon carbide layers, the stack of silicon carbide layers being configured to break along one or more of the helium plasma treated interfaces of the stack of silicon carbide layers under a removing force;
   at least one wall structure formed on the release layer around the at least one device; and
   at least one removable cap formed on the at least one wall structure.

2. The capped semiconductor device of claim 1, wherein the substrate comprises a silicon substrate.

3. The capped semiconductor device of claim 1, wherein the at least one wall structure comprises at least one first metal layer;
   the at least one removable cap comprises at least on second metal layer; and
   a welded connection is formed between the at least one wall structure and the at least one removable cap.

4. The capped semiconductor device of claim 3, wherein the at least one first metal layer comprises copper;
   the at least one second metal layer comprises tin; and
   the welded connection comprises a copper-tin bond.

5. The capped semiconductor device of claim 1, wherein the release layer has a first thermal expansion coefficient; and
   at least a portion of the wall structure that is in contact with the release layer has a second thermal expansion coefficient that differs from the first thermal expansion coefficient causing a transverse force to be exerted on the release layer.

6. The capped semiconductor device of claim 1, wherein the at least one device comprises a microelectromechanical systems device.

7. The capped semiconductor device of claim 1, wherein the removing force is heat-induced stress.

8. The capped semiconductor device of claim 1, wherein the removing force is a mechanical force.

9. A semiconductor device with a releasable cap, comprising:
   a substrate;
   at least one device formed on a surface of the substrate;
   a release layer encircling the at least one device, wherein the release layer comprises a stack of silicon carbide layers having helium plasma treated interfaces between adjacent ones of the silicon carbide layers, the stack of silicon carbide layers being configured to break along one or more of the helium plasma treated interfaces of the stack of silicon carbide layers under a removing force;
   a first wall structure formed on the release layer; and
   a cap formed on a second wall structure, wherein the second wall structure is welded to the first wall structure to form a welded wall structure, wherein a force removes the cap at the release layer prior to breaking the welded wall structure.

10. The semiconductor device of claim 9, wherein the removing force is heat-induced stress.

11. The semiconductor device of claim 9, wherein the removing force is a mechanical force.

12. The capped semiconductor device of claim 1, wherein the stack of silicon carbide layers are deposited on the substrate.

13. The capped semiconductor device of claim 12, wherein the silicon carbide layers are formed by plasma enhanced chemical vapour deposition.

14. The semiconductor device of claim 9, wherein the stack of silicon carbide layers are deposited on the substrate.

15. The semiconductor device of claim 14, wherein the silicon carbide layers are formed by plasma enhanced chemical vapour deposition.

16. The semiconductor device of claim 9, wherein the welded wall structure extends from the release layer to the cap and the welded wall structure is a non-continuous structure around the at least one device.

17. A capped semiconductor device, comprising:
a substrate comprising a surface;
at least one device formed on the surface;
a release layer formed at least in an area of the surface that encircles the at least one device, wherein the release layer comprises a stack of layers having hardened interfaces between adjacent ones of the layers, the stack of layers being deposited on the substrate, the hardened interfaces being formed by a plasma treatment, the stack of layers being configured to break along one or more of the hardened interfaces under a removing force;
at least one removable cap; and
at least one wall structure extending between the release layer and the at least one removable cap, and encircling the at least one device,
wherein the stack of layers comprises silicon carbide layers,
wherein the hardened interfaces are formed by helium plasma.

18. The capped semiconductor device of claim 17, wherein the at least one wall structure is a non-continuous structure around the at least one device.

* * * * *